United States Patent
Ali et al.

(10) Patent No.: US 9,490,777 B2
(45) Date of Patent: Nov. 8, 2016

(54) PROGRAMMABLE SYNCHRONOUS CLOCK DIVIDER

(71) Applicants: Inayat Ali, Jabalpur (IN); Puneet Dodeja, Delhi (IN); Sachin Jain, New Delhi (IN)

(72) Inventors: Inayat Ali, Jabalpur (IN); Puneet Dodeja, Delhi (IN); Sachin Jain, New Delhi (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 176 days.

(21) Appl. No.: 14/617,950

(22) Filed: Feb. 10, 2015

(65) Prior Publication Data

US 2016/0233852 A1 Aug. 11, 2016

(51) Int. Cl.
| | |
|---|---|
| H03K 21/00 | (2006.01) |
| H03K 3/017 | (2006.01) |
| H03K 23/00 | (2006.01) |
| H03K 21/02 | (2006.01) |
| H03K 21/10 | (2006.01) |

(52) U.S. Cl.
CPC ............ *H03K 3/017* (2013.01); *H03K 23/002* (2013.01); *H03K 21/00* (2013.01); *H03K 21/026* (2013.01); *H03K 21/10* (2013.01); *H03K 23/00* (2013.01)

(58) Field of Classification Search
None
See application file for complete search history.

(56) References Cited

U.S. PATENT DOCUMENTS

| | | | | |
|---|---|---|---|---|
| 5,524,035 | A * | 6/1996 | Casal | H03K 5/1565 377/47 |
| 6,278,307 | B1 | 8/2001 | El-kik | |
| 6,522,204 | B1 * | 2/2003 | Rennick | H03L 7/085 327/157 |
| 6,744,289 | B2 | 6/2004 | Nguyen | |
| 7,545,191 | B2 | 6/2009 | Austin | |
| 7,554,369 | B2 | 6/2009 | Kirichenko | |
| 7,898,309 | B1 * | 3/2011 | Dogan | H03K 5/1565 327/175 |
| 8,004,319 | B2 * | 8/2011 | Kumar | G06F 1/08 327/115 |
| 8,093,929 | B2 | 1/2012 | Jain | |
| 8,183,895 | B2 | 5/2012 | Park | |
| 8,218,712 | B1 * | 7/2012 | Jiang | H03K 23/546 327/115 |
| 8,378,719 | B1 | 2/2013 | Pace | |
| 8,471,608 | B2 | 6/2013 | Velayuthan | |
| 8,829,953 | B1 * | 9/2014 | Ali | H03K 21/026 327/115 |
| 2005/0168205 | A1 * | 8/2005 | Dwarakanath | H02M 3/157 323/283 |
| 2011/0234265 | A1 * | 9/2011 | Huang | G06F 1/08 327/115 |

\* cited by examiner

*Primary Examiner* — Tuan T Lam
(74) *Attorney, Agent, or Firm* — Charles E. Bergere

(57) ABSTRACT

A divided clock signal is generated from an input clock signal. The duty cycle of the divided clock signal is programmed by generating a compare value based on values of duty cycle input and a divide value of the input clock signal. The compare value is compared to a count value to generate short and long pulse signals. The divided clock signal is generated based on the short and long pulse signals. The duty cycle of the divided clock signal varies in accordance with the compare value.

20 Claims, 11 Drawing Sheets

PROGRAMMABLE SYNCHRONOUS CLOCK DIVIDER

BACKGROUND OF THE INVENTION

The present invention relates generally to integrated circuits, and, more particularly, to a synchronous clock divider integrated circuit.

Integrated circuits (ICs) include many sequential elements such as flip-flops, and latches. The frequency of operation of the sequential elements is governed by the cycling rate of clock signals. Duty cycle is an ON period of a single cycle of a clock signal. The duty cycle represents the ON time of a clock signal supplied to sequential elements. The cycling rate of the clock signals may be changed by changing divide ratios of clock divider circuit. The divide ratio is used to change the clock frequency of the clock signals.

Aging of sequential elements (silicon aging) and chip variations (e.g., due to process, voltage and temperature) may result in duty cycle degradation, thereby affecting data paths inside the ICs. Aging-induced duty cycle shift may occur in a particular direction (increased fall-delays or increased rise delays) depending on types of asymmetric components in a clock tree topology.

Therefore, control over the duty cycle is required to compensate for duty cycle degradation. Further, duty cycle of a clock signal may also be changed to provide timing relaxation of half cycle paths.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the scope of the present invention. The terms multiplexer and mux are used interchangeably.

The present invention is directed to a synchronous clock divider for generating divided clock signals with programmable duty cycle and programmable divide ratio. The clock divider may include one or more sequential logic elements. These sequential logic elements may comprise a counter for generating a count value at a rising edge of the input clock signal, and a comparator for comparing the count value with a ratio sample value (ratio_sample) (a constant number that may be predefined) for input clock.

Figure 1:
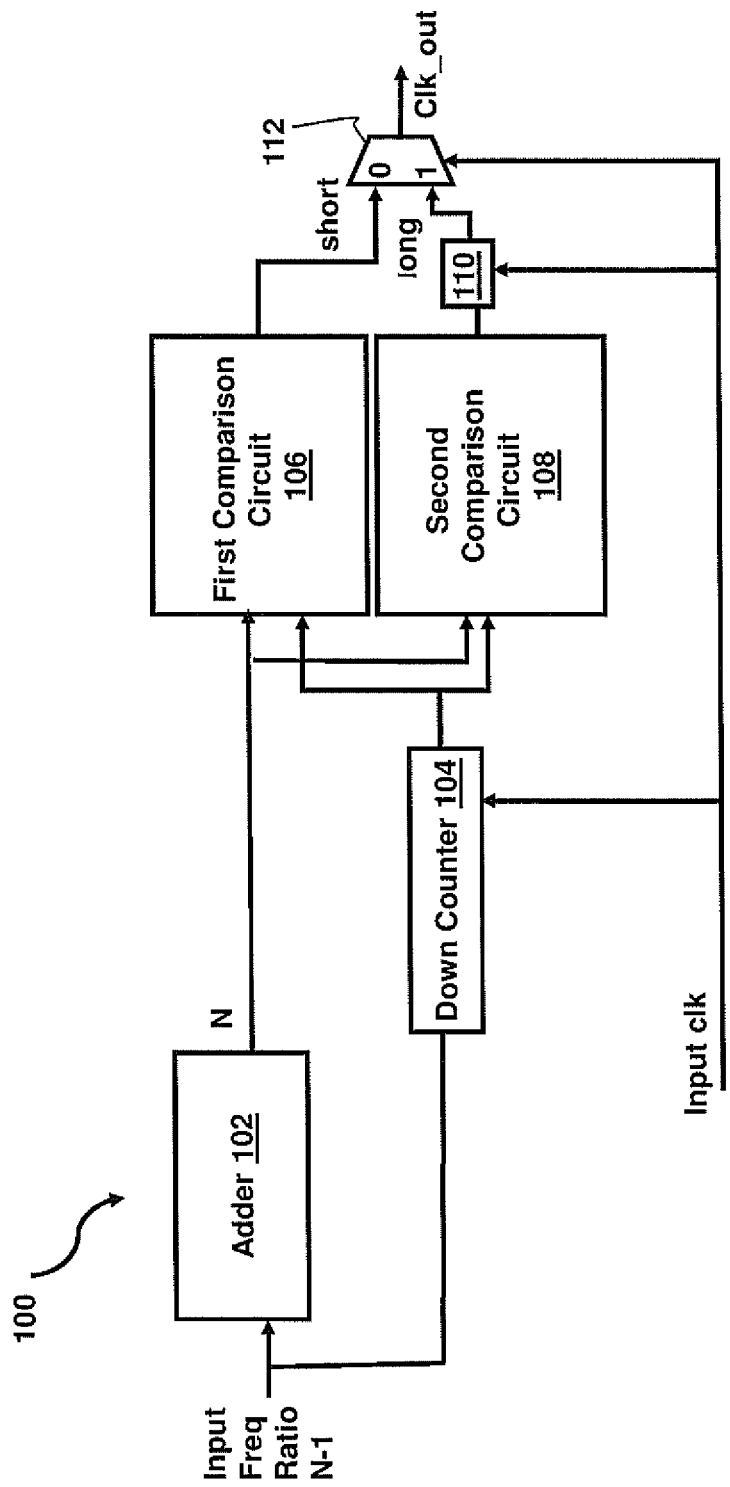
FIG. 1 is a schematic block diagram of a conventional clock divider circuit.

FIG. 1 illustrates a conventional clock divider 100 for generating a clock pulse with 50% duty cycle for even and odd divide ratios. The 50% duty cycle is fixed and may not be changed. The clock divider 100 comprises an adder 102 for providing a divide value N based on an input frequency ratio N-1. A down counter 104 receives an input clock signal and the input frequency ratio N-1 and generates a count value. The count value is provided to first and second comparison circuits 106 and 108 along with the divide value N. The output of the second comparison circuit goes to a latch 110 for generating a long pulse, while the output of the first comparison circuit 106 is provided to a multiplexer 112 as a short pulse. The multiplexer 112 also receives the output of the latch 110. The input clock signal is provided to the multiplexer 112 as a select signal and the multiplexer 112 outputs a divided clock (clk_out) with 50% duty cycle.

Figure 2:
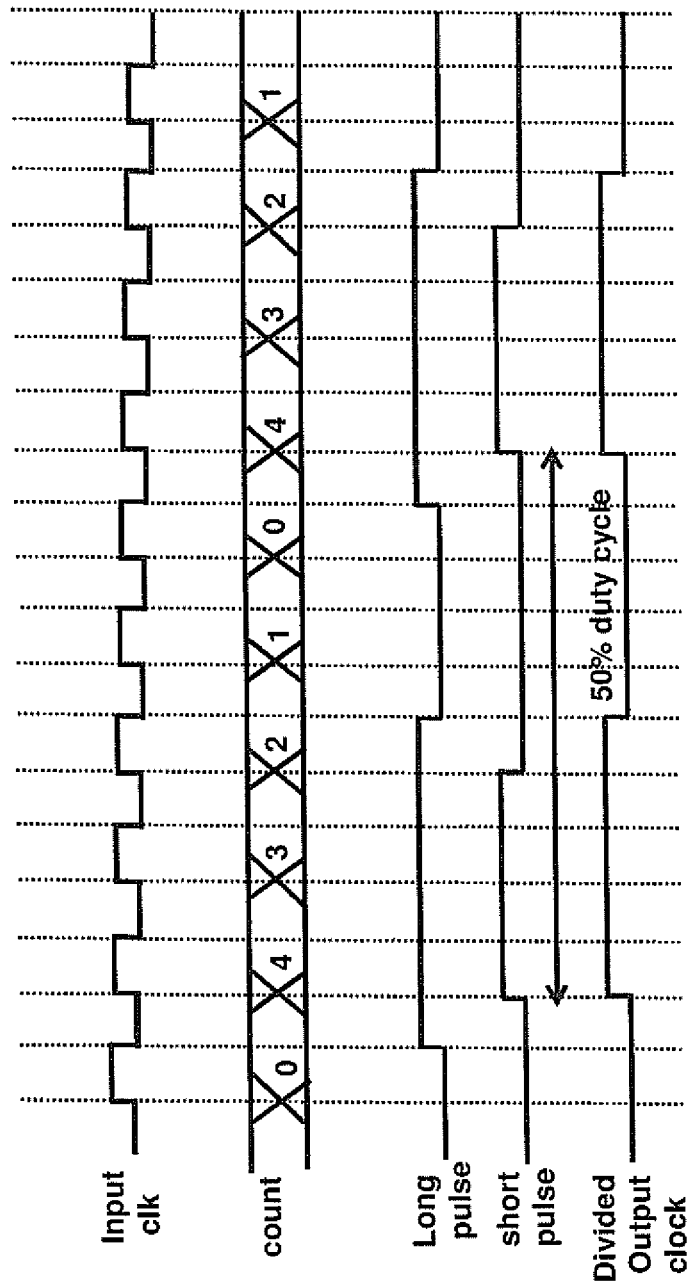
FIG. 2 is a timing diagram of signals of the clock divider circuit of FIG. 1.

FIG. 2 shows the generation of the divided clock signal with 50% duty cycle by the clock divider 100 for a count value of 5. The input clock signal is shown as a square wave. For the count value of 5, a long pulse and a short pulse are generated, and used to generate the divided output clock with a 50% duty cycle. The width of the long and short pulses is fixed for a particular divide ratio (frequency ratio) and thus the duty cycle cannot be modified.

Figure 3:
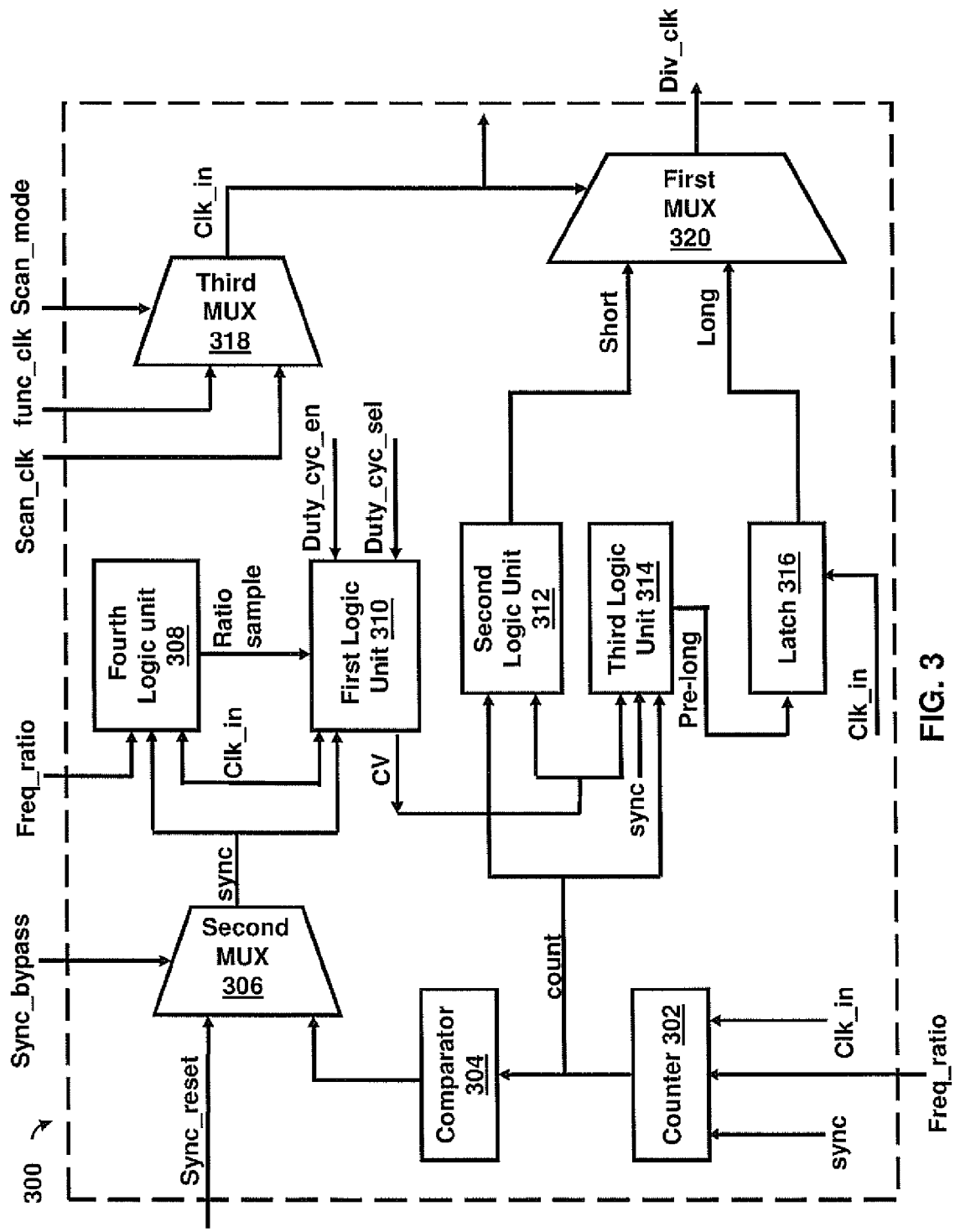
FIG. 3 is a schematic block diagram of a synchronous clock divider in accordance with an embodiment of the present invention.

Referring now to FIG. 3, a synchronous clock divider 300 in accordance with a preferred embodiment of the present invention is shown. The clock divider 300 preferably is part of an integrated circuit that include many other functional modules, such as part of a digital signal processor (DSP) or a System on a Chip (SOC) as is known in the art. The clock divider 300 includes a first logic unit 310 for generating a compare value (CV), a second logic unit 312 for generating a short pulse, a third logic unit 314 for generating a pre-long pulse, and a latch 316 for generating a long pulse. The clock divider 300 further includes a first multiplexer or mux 320 for generating a divided clock with a programmable duty cycle. The clock divider 300 further includes a down counter 302, a comparator 304, a second mux 306, a fourth logic unit 308, and a third mux 318.

The first mux 320 outputs the divided clock based on the short and long pulses. The short and long pulses are generated based on the compare value (CV) generated by the first logic unit 310. The third mux 318 generates an input clock signal (clk_in) that is used as a select input to the first mux 320.

The clock divider 300 receives a scan clock signal (scan_clk) and a functional clock signal (func_clk) and generates the input clock signal (clk_in) having an input clock signal frequency. More particularly, the scan_clk and the func_clk are input to the third mux 318. The third mux 318 then selects one of the scan_clk and the func_clk based on a scan mode signal (scan_mode) and outputs the input clock signal. The functional clock signal may include a system clock signal or a clock signal from an external clock divider.

The input clock signal is converted into an output clock signal with an output clock signal frequency by dividing the input clock signal with a divide value. In a preferred embodiment of the invention, the divide value comprises an integer (1, 2, 3, . . . , N). The output clock signal frequency may be less than the input clock signal frequency. The divide value may be controlled in number of ways. For example, the divide value may be provided by an external circuit or retrieved from a memory or data storage such as a shift register. The input frequency ratio (freq_ratio) is the divide value minus 1.

The down counter 302 receives a synchronization signal (sync) from the second mux 306, the input clock signal (clk_in) from the third mux 318, and a divide ratio (freq_ratio), which is the frequency ratio N−1. The counter 302 generates a count value with the divide ratio when the synchronization signal is high and decrements the count value on a rising edge of the input clock signal. The synchronization signal (sync) is provided to synchronize the input clock signal (clk_in) and the frequency ratio input (freq_ratio) and for setting the divide ratio. The divide ratio is used to divide a frequency of the input clock for generating the divided clock with any value of the duty cycle. As described in more detail below, the synchronization signal (sync) is generated by the second mux 306.

The comparator 304 receives the count value from the counter 302. The comparator 304 then produces a signal that is true if the count is zero and false if the count value is not zero. That is, the comparator 304 compares the signal received from the down counter with zero. As will be understood by those of skill in the art, signals may have either positive or negative logic values, where for positive logic, a high or logic "1" value is true, whereas for negative logic, a low (ground) or logic "0" value is true. Although the present invention is described using a high value as true, the invention should not be so limited.

The second mux 306 receives the signal output by the comparator and a reset signal (sync_reset) and selects one of these two signals as the synchronization signal based on a synchronization bypass (synch_bypass) signal, which is input to the second mux 306 as a select input. The sync_reset and sync_bypass signals are used to synchronize rising edges of the divided clock signal with other dividers present in the system. The sync signal generated by the divider 300 can be used as the sync_reset signal by other dividers in order to align the positive edge of the divided clocks of those dividers with the divided output clock of this divider 300, provided the input clock is the same for all the dividers. The sync_bypass signal should be high (true) when the divider 300 is to use an external sync_reset signal instead of the internal "sync" signal of the divider 300.

The fourth logic unit 308 receives the sync signal from the second mux 306, a divide ratio (freq_ratio), and the input clock signal (clk_in) from the third mux 318, and generates a ratio_sample signal. Generation of the ratio_sample signal will be described in more detail with reference to FIG. 4.

Figure 4:
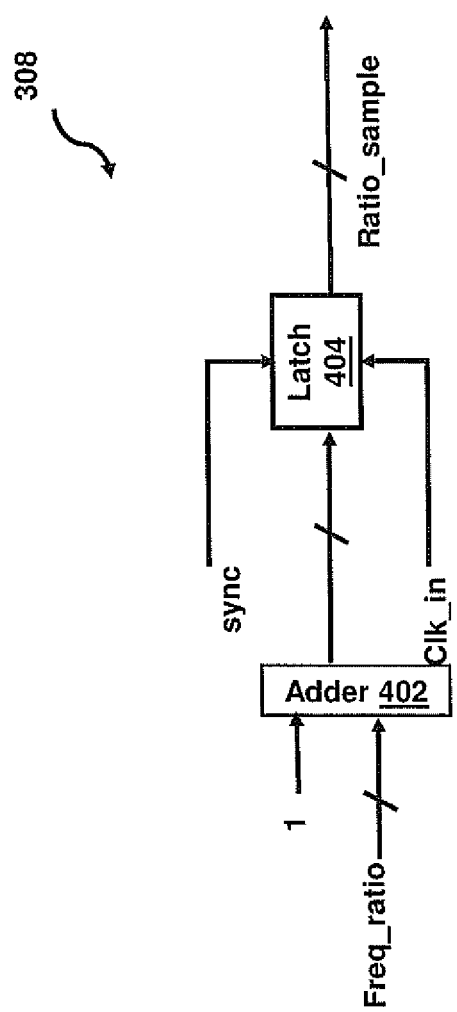
FIG. 4 is a schematic block diagram of a fourth logic unit of the clock divider of FIG. 3.

Referring to FIG. 4, in one embodiment, the fourth logic unit 308 comprises an adder 402 and a latch 404 connected to the adder 402. The adder 402 receives the divide ratio (freq_ratio) and one (1), and adds one to the divide ratio to adjust the divide ratio of the input clock signal (clk_in). The latch 404 receives the output of the adder 402 at its data input, and generates a ratio_sample signal (ratio_sample). The latch 404 also receives the sync signal generated by the second mux 306 and the input clock signal (clk_in) from the third mux 318. In a preferred embodiment, the latch 404 is programmable latch that accepts input data from the adder 402 when the synchronization signal (sync) is high and upon a rising edge of clk_in. The ratio sample signal is an integer value defined by the divide ratio. For example, the ratio_sample has a value of 4 if the input frequency ratio is 3, as it comprises the input frequency ratio of 3 plus 1, as generated by the adder 402. The divide value may be re-programmed or dynamically generated, such as via a programmable register or chip input pins. The output of the fourth logic unit 308, which is the ratio_sample signal, is provided to the first logic unit 310.

Referring back to FIG. 3, the first logic unit 310 is configured to program the duty cycle of the output clock by generating a compare value CV. The first logic unit 310 is connected to the fourth logic unit 308 and receives the ratio_sample signal generated by the fourth logic unit 308. The first logic unit 310 also receives the synchronization signal (sync), the input clock signal (clk_in), as well as a duty cycle enable signal (duty_cyc_sel) and a duty cycle enable signal (duty_cyc_en). The duty_cyc_sel is a multi-bit integer value used to vary the duty cycle of the input clock, and may be obtained from an external source (e.g., a shift register). The duty_cyc_en signal can come from a programmable register or chip input pins. When the duty_cyc_en signal is active (true), the variation in duty cycle of the divided clock is enabled. The first logic unit 310 receives these signals and generates the compare value (CV) that is provided to the second and third logic units 312 and 314.

Figure 5:
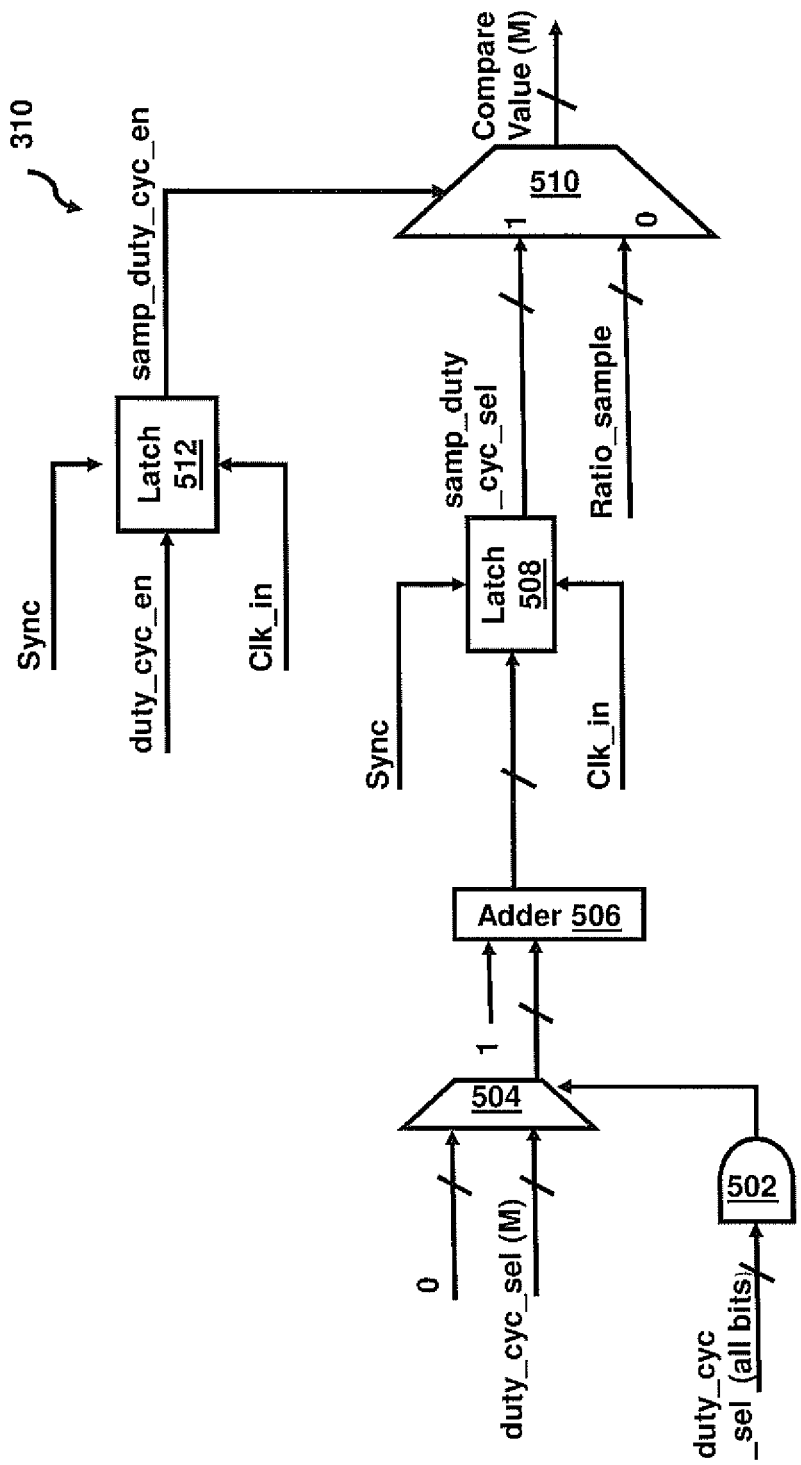
FIG. 5 is a schematic block diagram of a first logic unit of the clock divider of FIG. 3.

Referring to FIG. 5, one embodiment of the first logic unit 310 is illustrated. The first logic unit 310 includes an AND gate 502 that receives all bits of the duty_cyc_sel signal at its inputs and performs an AND operation thereon. The output of the AND gate 502 is input to a fourth mux 504 as its select input. The fourth mux 504 receives a zero at a first input terminal and a (duty_cyc_sel (M)) at a second input terminal. The duty_cyc_sel signal can come from a programmable register or can be input from pins of the SoC. The duty_cyc_sel signal is used to specify the duty cycle of the divided output clock when the duty_cyc_en signal is active (see table 1 below). The output of the fourth mux 504 is input to an adder 506, which increments this input and provides the incremented value to a first latch 508 at its data input terminal. The first latch 508 also receives the sync signal generated by the second mux 306 and the input clock signal generated by the third mux 318. In a preferred embodiment, the latch 508 is a programmable latch that accepts input data from the adder 506 when the sync signal is high and at a rising edge of the input clock signal (clk_in).

The first latch 508 generates a samp_duty_cyc_sel signal, which is a sampled value of the incremented duty_cyc_sel signal, sampled on the clk_in when sync signal is high, similar to the generation of the ratio_sample signal. The output of the first latch 508 is provided to a data input terminal of a fifth mux 510, along with the ratio_sample signal generated by the fourth logic unit 308, which is input to another data input terminal thereof. The fifth MUX 510 generates the compare value CV. A second latch 512 receives the duty_cyc_en signal at its input data terminal, the sync signal generated by the second mux 306, and the input clock signal (clk_in) generated by the third mux 318. In a preferred embodiment, the second latch 512 is a programmable latch that accepts the input data duty_cyc_en when the sync signal is high and at a rising edge of clk_in, and generates a samp_duty_cyc_en signal that is provided to the fifth mux 510 at its select input terminal, and is used to enable or disable programming of the duty cycle by alternatively selecting input 0 or 1. If the duty_cyc_en is high then the duty cycle of the output clock signal (div_clk) of the clock divider 300 is programmable by changing the duty_cyc_sel signal. If the duty_cyc_en signal is low then the clock divider 300 operates like the conventional clock divider (shown in FIG. 1) without the input of duty cycle sampled and does not provide any variation in the duty cycle.

The fourth mux 504 and the adder 506 are provided to prevent a bit-overflow condition in case the duty_cyc_sel input bits are all high. For example, if all bits of the duty_cyc_sel input to the AND gate 502 are 1 (for example 111), the output of the adder 502 may overflow and hamper the generation of the divided clock signal (i.e., output clock signal div_clk).

Referring back to FIG. 3, both of the second and third logic units 312 and 314 receive the CV signal generated by the first logic unit 310. The second and third logic units 312 and 314 both also receive the count signal generated by the down counter 302. The second logic unit 312 generates a short pulse signal, while the third logic unit 314 generates a pre-long pulse signal.

Figure 6:
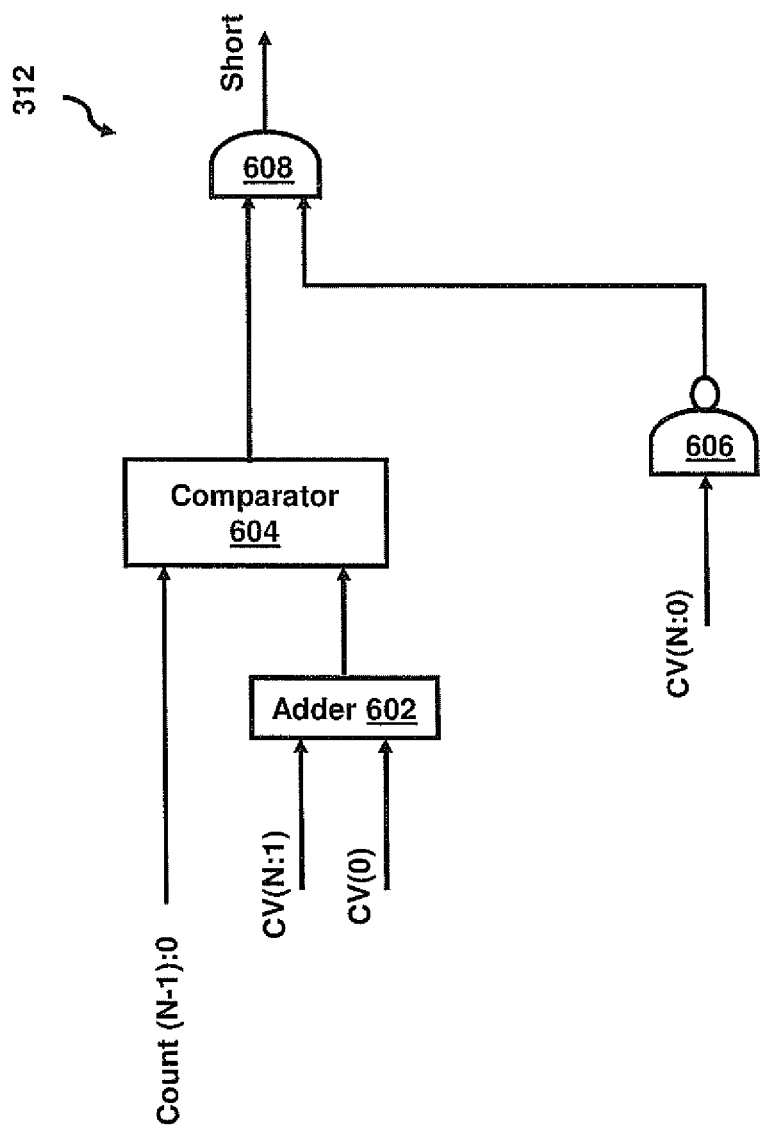
FIG. 6 is a schematic block diagram of a second logic unit of the clock divider of FIG. 3.

FIG. 6 is a schematic block diagram of the second logic unit 312 in accordance with an embodiment of the present invention. The second logic unit 312 essentially modifies a width of a short pulse for varying the duty cycle of the output clock signal (div_clk). In this embodiment, the second logic unit 312 includes an adder 602, a comparator 604, a NAND gate 606 and an AND gate 608. The adder 602 adds various bits of the compare value (CV), such as CV(0) and CV(N:1) and the sum is input to the comparator 604, which compares the sum from the adder 602 with the count(N−1:0) from the down counter 302. The comparator 604 produces a high value if the count value is greater than or equal to the sum from the adder 602 or a low value otherwise. The NAND gate 606 performs a NAND operation of the bits of the compare value (CV) and the output of the NAND gate 606 is provided as an input to the AND gate 608 to be ANDed with the output of the comparator 604. The output of the AND gate 608 is the short pulse signal.

Figure 7:
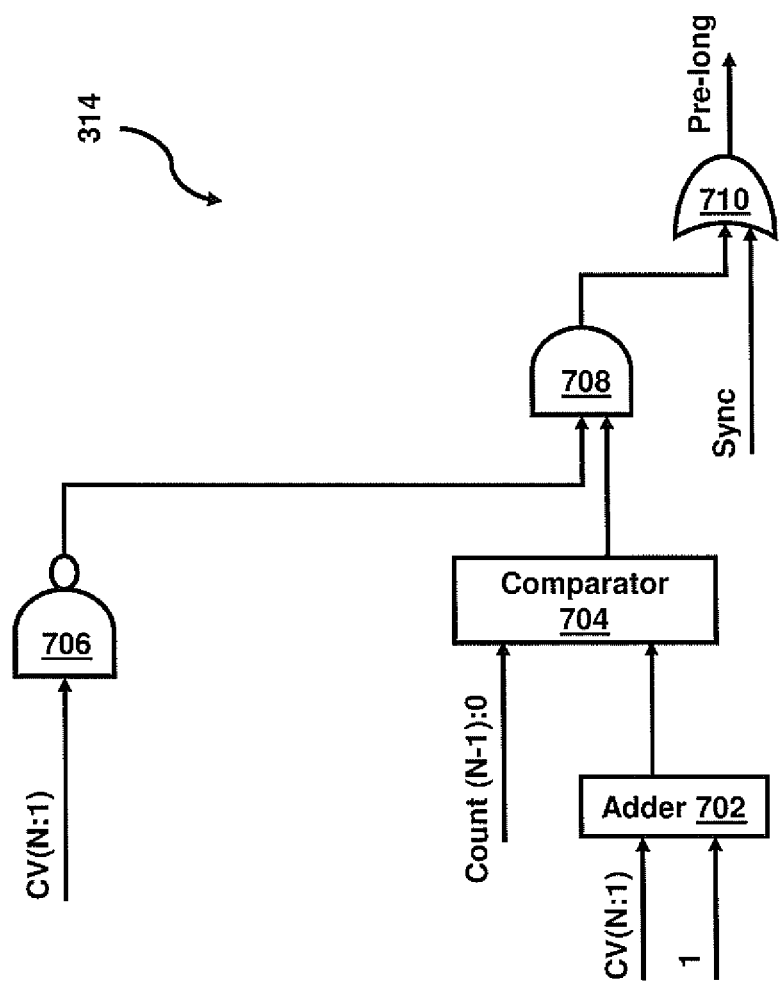
FIG. 7 is a schematic block diagram of a third logic unit of the clock divider of FIG. 3.

FIG. 7 is a schematic block diagram of the third logic unit 314 in accordance with an embodiment of the present invention. The third logic unit 314 is provided to modify a width of the pre-long pulse (thereby modifying the long pulse) for varying the duty cycle of the output clock signal (div_clk). In this embodiment, the third logic unit 314 includes an adder 702, a comparator 704, a NAND gate 706, an AND gate 708, and an OR gate 710. The adder 702 increments the compare value (N:1) and then the comparator 704 compares this incremented value with the count value bits (N−1):0 from the down counter 302. The comparator 704 produces a high value if the count value is greater than or equal to the sum from the adder 702 or a low value otherwise. The NAND gate 706 performs a NAND operation on the bits of the compare value (CV(N:1)). The AND gate 708 performs an AND operation on the output of the NAND gate 706 and the output of the comparator 704. The OR gate 710 receives the output of the AND gate 708 and the sync signal generated by the second mux 306 and generates the pre-long signal.

The duty cycle of the divided clock signal varies in accordance with the compare value (CV), as the compare value controls a modification or variation in the short pulse and the long pulse. The compare value (CV) generated by the first logic unit 310 modifies a width of the short pulse in order to control the duty cycle of the output clock signal due to the use of the NAND gate 606 and the AND gate 608. For example, if duty cycle=1/(2×ratio_sample), and the input ratio is all 1's, the second logic unit 312 will generate a short pulse at 0 level (i.e., low).

Referring back to FIG. 3, the pre-long signal is provided to the latch 316, which generates the long pulse signal. More particularly, the pre-long signal is input to the data input terminal of the latch 316, the clk_in signal is input to the clock terminal of the latch 316, and the long pulse signal is generated at the data output terminal of the latch 316.

Thus, the compare value CV modifies a width of the long pulse in order to control the duty cycle of the output clock pulse (div_clk). For example, using the same example values as above, if the duty cycle=1/(2×ratio_sample), and the input ratio is all 1's, the AND gate 708 will generate a low level output.

In accordance with an embodiment, table 1 shows duty cycle values programmed for generating the compare value (CV) (for the divide value) generated by the first logic unit 310.

TABLE 1

| DIVIDE VALUE | POSSIBLE VALUES OF DUT_CYC_SEL | DUTY CYCLE VARIATIONS FOR EACH DUT_CYC_SEL VALUE |
|---|---|---|
| 2 | 0, 1, 2 | 0.75, 0.5, 0.25 |
| 3 | 0, 1, 2, 3, 4 | 0.833, 0.667, 0.5, 0.33, 0.1667 |
| 4 | 0, 1, 2, 3, 4, 5, 6 | 0.875, 0.75, 0.625, 0.5, 0.375, 0.25, 0.125 |
| 6 | 0, 1, 2, 3, 4, 5, 6, 7, 8, 9, 10 | 0.917, 0.833, 0.75, 0.667, 0.583, 0.5, 0.416, 0.33, 0.25, 0.167, 0.083 |

By way of an example, let the divide value be 2 and the input clock signal 100 MHz. The ratio_sample value for the divide value is 2 (as the input frequency ratio is 1). The possible values for the duty_cyc_sel include 0, 1 and 2. The first logic unit 310 programs the duty_cyc_sel values 0, 1 and 2 to generate the duty cycle of 75%, 50% and 25% respectively and generates the compare value (CV) for the variation in the duty cycle values.

The third logic unit 314 receives the synchronized signal, which is used to produce the pre-long pulse. The latch 316 receives the pre-long pulse value from the third logic unit 314 and delays outputting the value by one-half cycle of clk_in by using an inverted signal of clk_in, thereby generating the long pulse. The first mux 320 selects the signal from the latch 316 and produces div_clk.

In one embodiment, the clock divider 300 may be included in an integrated circuit, an application specific circuit (ASIC), or a programmable gate array (FPGA). The clock divider 300 may be implemented for analog and digital applications. The duty cycle of the clock in the clock divider 300 may be changed for a particular clock frequency ratio without affecting operation of the clock divider 300.

Figure 8:
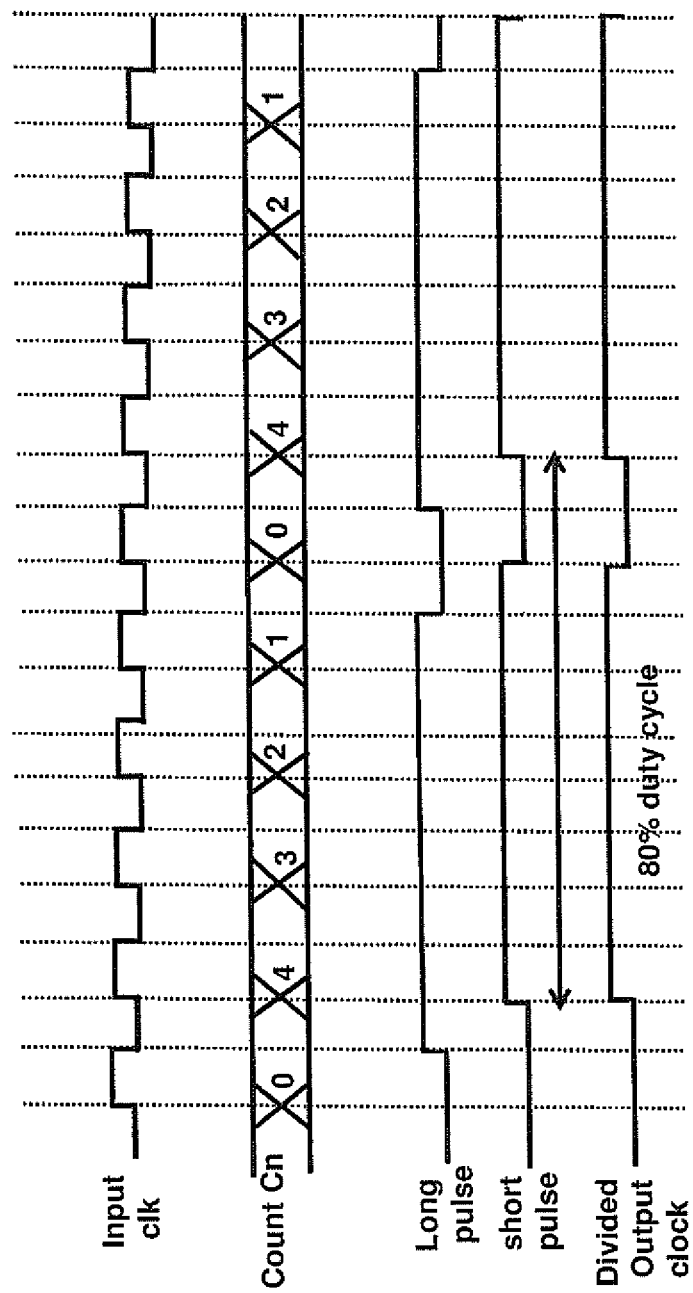
FIG. 8 illustrates a divided clock signal with 80% duty cycle generated by the clock divider of FIG. 3 in accordance with an embodiment of the present invention.

Referring now to FIG. 8, an output clock signal with 80% duty cycle is shown. $C_n$ is the count generated by the counter 302. Input clock has a waveform that is provided to the clock divider 300. The input clock signal has a 50% duty cycle. The short pulse is the output of the second logic unit 312 and the long pulse is the output of the latch 316. The short and long pulses are generated based on the compare value CV. The output clock pulse (divided clock pulse) is the output generated by the first mux 320 by selecting one of the short and long pulses. The duty cycle of the divided clock signal varies according to the compare value (CV), as the compare value provides a variation in the duty cycle of the output clock signal.

Figure 9:
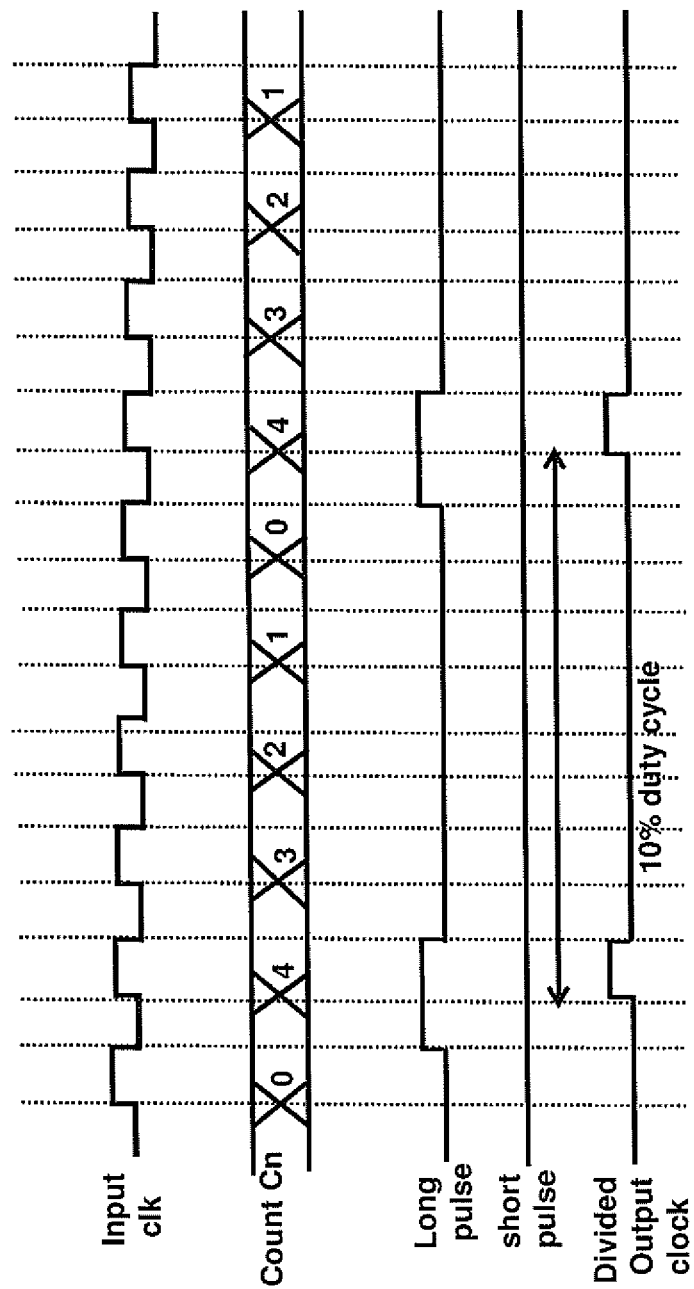
FIG. 9 illustrates a divided clock signal with 10% duty cycle generated by the clock divider of FIG. 3 in accordance with an embodiment of the present invention.

In another example, FIG. 9 shows an output clock signal (divided clock signal) with 10% duty cycle for a divide value of 5. The width of the short pulse generated by the second logic unit 312 is 0. The width of the long pulse is controlled based on the compare value (CV) and the NAND gate 706, the OR gate 710, the comparator 702 and the AND gate 708.

Figure 10:
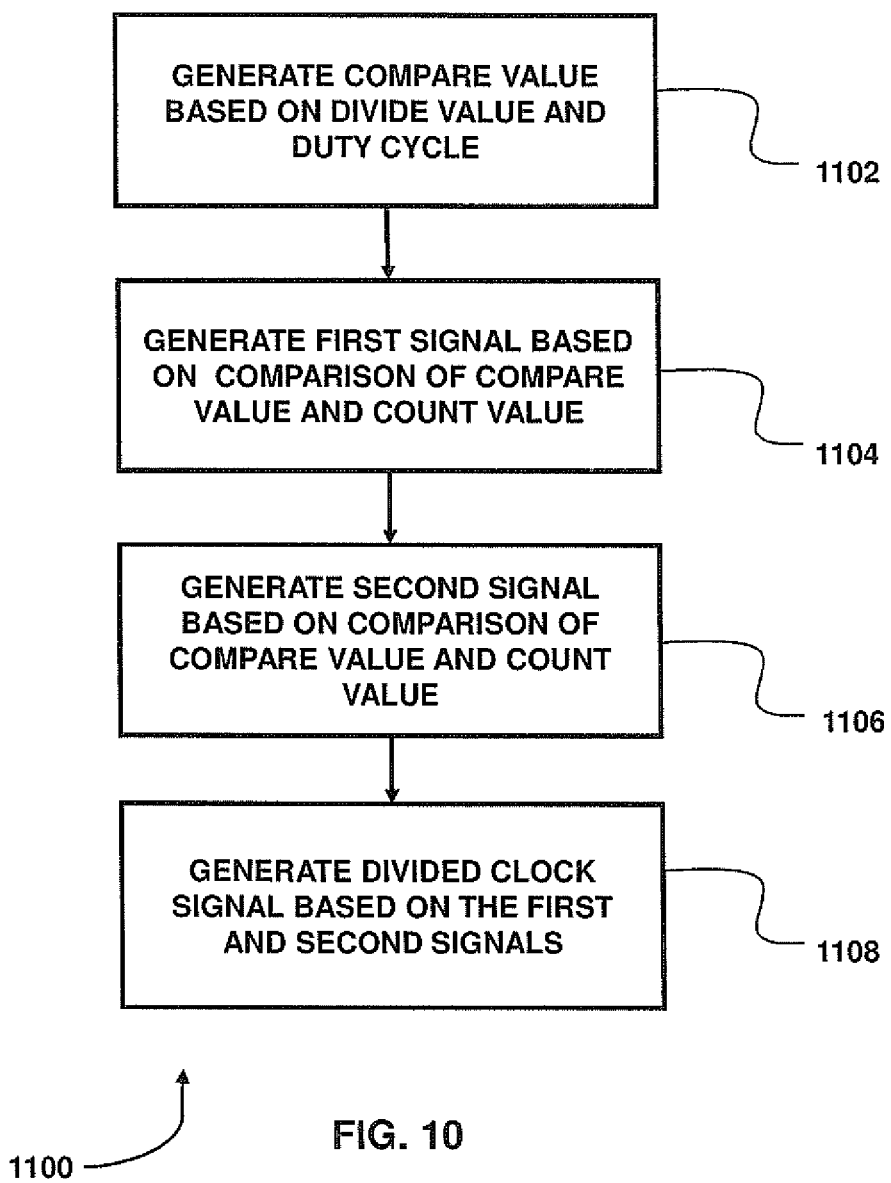
FIG. 10 is a flow chart of a method for generating a divided clock signal in accordance with an embodiment of the present invention.

Referring now to FIG. 10, a method 1100 for generating a divided clock in a computing environment is shown, in accordance with an embodiment of the present invention. The method 1100 may be described in the general context of computer executable instructions. Generally, computer executable instructions may include routines, programs, objects, components, data structures, procedures, modules, functions, etc., that perform particular functions or implement particular abstract data types. The method 1100 may also be practiced in a distributed computing environment where functions are performed by remote processing devices that are linked through a communications network. In a distributed computing environment, computer executable instructions may be located in both local and remote computer storage media, including memory storage devices.

The order in which the method 1100 is described is not intended to be construed as a limitation, and any number of the described steps can be combined in any order to implement the method 1100 or alternate methods. Additionally, individual blocks may be deleted from the method 1100 without departing from the scope of the subject matter described herein. Furthermore, the method can be implemented in any suitable hardware, software, firmware, or combination thereof. However, for ease of explanation, in the embodiments described below, the method 1100 may be considered as implemented in the above described clock divider 300 as part of an integrated circuit such as a SoC.

At step 1102, a compare value is generated based on a divide value and at least one duty cycle value of an input clock. In an embodiment, the first logic unit 310 of FIG. 3 generates the compare value.

The method 1100 provides a selection of a ratio sample value for the input clock signal. The ratio_sample value comprises an input frequency ratio of the output clock signal and an integer value. The integer value is 1. By way of an example, the ratio_sample value of 4 comprises the input frequency ratio of 3 and the integer value of 1. The input frequency ratio may be re-programmed or dynamically generated by way of one or more electronic devices, as previously discussed.

At step 1104, a first signal is generated based on a comparison of the compare value (CV) generated at step 1102 with a count value. In an embodiment, the first signal may be generated by the second logic unit 312 of the clock divider 300.

At step 1106, a second signal is generated based on a comparison of the compare value (CV) with a count value. In an embodiment, the second signal may be generated by the third logic unit 314.

At step 1108, an output clock signal (divided clock) is generated based on the first signal and the second signal. In an embodiment, the output clock signal may be generated by the first mux 320 of the clock divider 300.

In accordance with an embodiment, the method 1100 comprises enabling and disabling programming of the duty cycle. The enabling and the disabling may be provided by the first logic unit 310.

Figure 11:
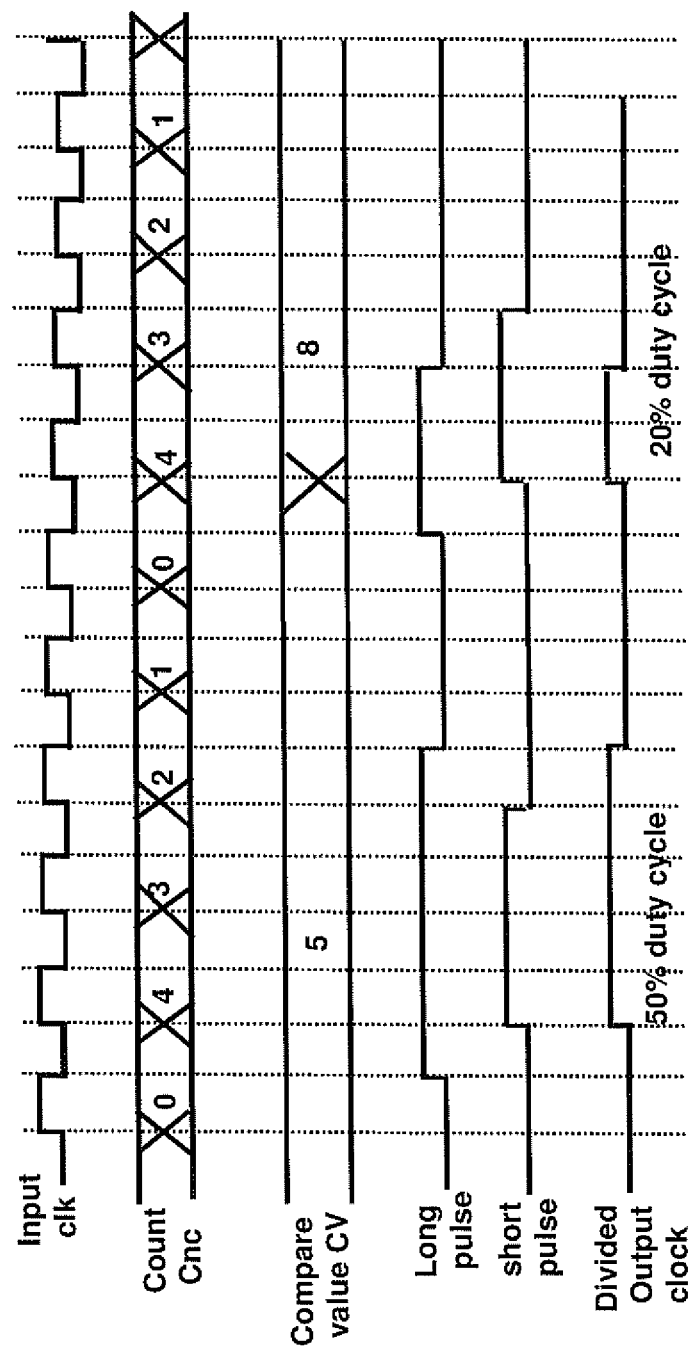
FIG. 11 is a timing diagram illustrating a transition in duty cycle of an output clock signal from 50% to 20% due to a change in duty cycle programming in a clock divider, in accordance with an embodiment of the present invention.

In accordance with an embodiment, FIG. 11 shows an output clock signal with a duty cycle a transitioning from 50% to 20% due to change in duty cycle programming. When the variation in the duty cycle is enabled by providing the duty cycle input of duty_cyc_sel and duty_cyc_en to the first logic unit 310, the compare value 8 is generated which results in a generation of the divided clock signal with 20% duty cycle for the divide value of 5. Whereas, the 50% duty cycle may be generated when the duty_cyc_en is 0 and there is no variation in the duty cycle of the output clock for the divide value of 5 and the compare value of 5.

Although implementations of an integrated circuit, a clock divider, and a method for programming a duty cycle of an input clock signal have been described in language specific to structural features and/or methods, it is to be understood that the appended claims are not necessarily limited to the specific features or methods described. Rather, the specific features and methods are disclosed as examples of implementations for programming a duty cycle of an input clock signal. Thus, numerous modifications, changes, variations, substitutions, and equivalents will be apparent to those skilled in the art, without departing from the scope of the present invention, as described in the claims.

The invention claimed is:

1. A clock divider for generating a divided clock signal, comprising:
    a first logic unit for generating a compare value based on a divide value and at least one duty cycle input of an input clock;
    a second logic unit for generating a first signal based on a comparison of the compare value and a count value;
    a third logic unit for generating a second signal based on a comparison of the compare value, the count value, and a synchronization signal; and
    a first multiplexer for generating the divided clock signal based on the first signal and the second signal, wherein a duty cycle value of the divided clock signal varies in accordance with the compare value.

2. The clock divider of claim 1, wherein the at least one duty cycle input comprises a duty cycle enable signal and a duty cycle select signal.

3. The clock divider of claim 1, wherein the first logic unit comprises:
    an AND gate;
    a second mux that receives the at least one duty cycle input, wherein a value of the duty cycle input is selected using an output of the AND gate;
    an adder connected to the second mux for incrementing an output thereof;
    a first latch connected to the adder for receiving an output of the adder;
    a third mux connected to the first latch for receiving an output of the latch and the divide value; and
    a second latch that provides a select input to the third mux for enabling and disabling a variation in a duty cycle of the divided clock signal.

4. The clock divider of claim 1, wherein the second logic unit comprises:

an adder for generating an intermediate compare value from the compare value;
a first comparator coupled to the adder for comparing the intermediate compare value and the count value; and
an AND gate connected to the first comparator for receiving a comparison result therefrom, and an input from a NAND gate, wherein the AND gate outputs the first signal.

5. The clock divider of claim 1, wherein the third logic unit comprises:
an adder for generating an intermediate compare value from the compare value;
a comparator coupled to the adder for comparing the intermediate compare value and the count value;
an AND gate coupled to the comparator for receiving the comparison result, and to a NAND gate for receiving an input therefrom; and
an OR gate coupled to the AND gate for receiving an output thereof, and for receiving a synchronization signal, and generating the second signal.

6. The clock divider of claim 1, further comprising:
a fourth logic unit for generating a ratio sample signal from the divide value, wherein an output of the fourth logic unit is coupled to the first logic unit for providing the ratio sample signal thereto.

7. The clock divider of claim 6, wherein the fourth logic unit comprises an adder coupled to a latch, wherein the adder adds one to the divide value and the incremented value is stored in the latch.

8. The clock divider of claim 1, further comprising:
a latch, coupled to the third logic unit, for generating a long pulse based on the second signal, wherein the long pulse is input to the first mux in lieu of the second signal.

9. A method for generating a divided clock signal from an input clock signal, the method comprising:
generating, by a first logic unit, a compare value based on a divide value and at least one duty cycle input for an input clock;
generating, by a second logic unit, a first signal based on a comparison of the compare value and a count value;
generating, by a third logic unit, a second signal based on a comparison of the compare value and the count value; and
generating, by a first multiplexer, the divided clock signal based on the first signal and the second signal.

10. The method of claim 9, wherein generating the first signal comprises modifying a width of the first signal, thereby providing a variation in the duty cycle of the divided clock signal.

11. The method of claim 10, wherein generating the second signal comprises modifying a width of the second signal, thereby providing a variation in the duty cycle of the divided clock signal.

12. The method of claim 11, further comprising enabling and disabling variation in the duty cycle of the input clock.

13. An integrated circuit including a clock divider for generating a divided clock signal, comprising:
a clock signal selector that receives a scan clock signal and a functional clock signal and outputs an input clock signal based on a scan mode signal;
a first logic unit for generating a compare value based on a divide value and at least one duty cycle value of the input clock signal;
a second logic unit for generating a first signal based on a comparison of the compare value and a count value;
a third logic unit for generating a second signal based on a comparison of the compare value and the count value;
a first multiplexer that receives the first signal at a first data input terminal the second signal at a second data input terminal, and the input clock signal at a select terminal, and outputs the divided clock signal.

14. The integrated circuit of claim 13, wherein the at least one duty cycle value comprises a duty cycle enable signal and a duty cycle select signal.

15. The integrated circuit of claim 14, further comprising a first latch having a data input terminal connected to the third logic unit for receiving the second signal, and an output terminal connected to the second data terminal of the first mux, wherein the second signal is delayed by the first latch before being input to the first multiplexer.

16. The integrated circuit of claim 15, wherein the first logic unit comprises:
an AND gate;
a second mux that receives the at least one duty cycle input, wherein a value of the duty cycle input is selected using an output of the AND gate;
an adder connected to the second mux for incrementing an output thereof;
a first latch connected to the adder for receiving an output of the adder;
a third mux connected to the first latch for receiving an output of the latch and the divide value; and
a second latch that provides a select input to the third mux for enabling and disabling a variation in a duty cycle of the divided clock signal.

17. The integrated circuit of claim 15, wherein the second logic unit comprises:
an adder for generating an intermediate compare value from the compare value;
a first comparator coupled to the adder for comparing the count value and the intermediate compare value; and
an AND gate connected to the first comparator for receiving a comparison result therefrom, and an input from a NAND gate, wherein the AND gate outputs the first signal.

18. The integrated circuit of claim 15, wherein the third logic unit comprises:
an adder for generating an intermediate compare value from the compare value;
an comparator coupled to the adder for comparing the count value and the intermediate compare value;
an AND gate coupled to the comparator for receiving the comparison result, and to a NAND gate for receiving an input therefrom; and
an OR gate coupled to the AND gate for receiving an output thereof, and for receiving a synchronization signal, and generating the second signal.

19. The integrated circuit of claim 15, further comprising a fourth logic unit for generating a ratio sample signal from the divide value, wherein an output of the fourth logic unit is coupled to the first logic unit for providing the ratio sample signal thereto.

20. The integrated circuit of claim 10, wherein the fourth logic unit comprises an adder coupled to a latch, wherein the adder adds one to the divide value and the incremented value is stored in the latch.

* * * * *